United States Patent
Takahashi et al.

(10) Patent No.: US 7,310,236 B2
(45) Date of Patent: Dec. 18, 2007

(54) ELECTRONIC DEVICE

(75) Inventors: Yoshitake Takahashi, Tokyo (JP);
Yoshihisa Tsuchida, Chiba (JP);
Masayoshi Morikawa, Kanagawa (JP)

(73) Assignee: Sony Corporation (JP)

(*) Notice: Subject to any disclaimer, the term of this patent is extended or adjusted under 35 U.S.C. 154(b) by 139 days.

(21) Appl. No.: 10/888,290

(22) Filed: Jul. 9, 2004

(65) Prior Publication Data

US 2005/0024835 A1 Feb. 3, 2005

(30) Foreign Application Priority Data

Jul. 30, 2003 (JP) ............................. P2003-283228

(51) Int. Cl.
*H05K 5/00* (2006.01)
(52) U.S. Cl. ..................... 361/757; 361/752; 361/753
(58) Field of Classification Search ............... 361/757, 361/752, 753
See application file for complete search history.

(56) References Cited

U.S. PATENT DOCUMENTS

| | | | | |
|---|---|---|---|---|
| 4,657,325 | A * | 4/1987 | Marks et al. ................. 439/68 |
| 4,851,614 | A * | 7/1989 | Duncan, Jr. .................. 174/263 |
| 5,369,494 | A * | 11/1994 | Bowden et al. ............. 356/402 |
| 5,414,223 | A * | 5/1995 | Suski et al. .................. 174/262 |
| 5,644,103 | A * | 7/1997 | Pullen et al. ................ 174/541 |
| 5,663,869 | A * | 9/1997 | Vinciarelli et al. ......... 361/707 |
| 5,778,526 | A * | 7/1998 | Vinciarelli et al. ........... 29/840 |
| 5,805,402 | A * | 9/1998 | Maue et al. ................ 361/93.1 |
| 6,028,775 | A * | 2/2000 | Batten et al. ................ 361/816 |
| 6,090,728 | A * | 7/2000 | Yenni et al. ................. 442/117 |
| 6,230,610 | B1 * | 5/2001 | Pippert ....................... 92/170.1 |
| 6,410,847 | B1 * | 6/2002 | Allen et al. ............. 174/35 MS |
| 6,440,593 | B2 * | 8/2002 | Ellison et al. ............ 428/294.1 |
| 6,457,877 | B2 * | 10/2002 | Kato et al. ..................... 385/92 |
| 6,500,585 | B1 * | 12/2002 | Saakes et al. ................ 429/232 |
| 6,617,786 | B1 * | 9/2003 | Centofante .................. 313/512 |
| 6,651,659 | B2 * | 11/2003 | Izuchukwu ............. 128/205.15 |
| 6,711,354 | B2 * | 3/2004 | Kameyama .................. 396/301 |
| 6,717,065 | B2 * | 4/2004 | Hosaka et al. ............... 174/259 |
| 6,821,819 | B1 * | 11/2004 | Benavides et al. .......... 438/122 |
| 6,846,184 | B2 * | 1/2005 | Fan et al. ...................... 439/66 |
| 6,879,096 | B1 * | 4/2005 | Miyazaki et al. ............ 313/495 |

FOREIGN PATENT DOCUMENTS

| | | |
|---|---|---|
| JP | 6-240049 | 8/1994 |
| JP | 8-056092 A | 2/1996 |
| JP | 10-256772 A | 9/1998 |
| JP | 2000-207060 | 7/2000 |
| JP | 2001-225371 | 8/2001 |
| JP | 2002-118371 | 4/2002 |

* cited by examiner

*Primary Examiner*—Dean A. Reichard
*Assistant Examiner*—Hung S Bui
(74) *Attorney, Agent, or Firm*—Lerner, David, Littenberg, Krumholz & Mentlik, LLP

(57) ABSTRACT

A casing that has an electronic component housed therein has a conductive layer made of a mixture of carbon fibers and a thermoplastic resin and an insulating layer where only the thermoplastic resin is exposed on a surface of the conductive layer. The casing prevents leakage of unwanted electromagnetic waves from inside, is not affected by external electromagnetic waves, has small thickness, light weight, high strength and high rigidity, and has excellent contactability with a coating.

9 Claims, 6 Drawing Sheets

ELECTRONIC DEVICE

BACKGROUND OF THE INVENTION

1. Field of the Invention

This invention relates to an electronic device using a carbon fiber reinforced resin for its casing.

This application claims priority of Japanese Patent Application No.2003-283228, filed on Jul. 30, 2003, the entirety of which is incorporated by reference herein.

2. Description of the Related Art

Generally, in electronic devices such as digital still cameras, digital video cameras, radio receivers, television receivers, personal computers and personal digital assistants (PDAs), sufficient measures to prevent electromagnetic interruption (EMI) and to strengthen immunity must be taken so that radiation of unwanted electromagnetic waves (unwanted radiation) and malfunction due to the influence of external electromagnetic waves can be prevented when electronic components housed in the casings operate.

For example, in a digital video camera, unwanted electromagnetic noise is generated from a charge couple device (CCD), which is an image pickup device, and a printed circuit board having a driving control circuit of a rotary head unit mounted thereon. To prevent leakage of unwanted radiation noise generated from the CCD and the printed circuit board, the CCD and the printed circuit board are covered with shield cases made of a conductive metal, respectively, and the shield cases are grounded. Since a head amplifier for processing and amplifying minute video signals need be protected from external electromagnetic waves, it is shielded by a shield plate. However, each of these shielding measures complicates the device structure and makes its assembly difficult.

Thus, in such an electronic device, its outer casing is made of an electromagnetic absorbing material such as ceramics or magnesium alloy so that the outer casing absorbs unwanted electromagnetic waves generated from internal electronic components and external electromagnetic waves. In this manner, occurrence of noise and electromagnetic interruption is prevented and the function the device is stabilized without taking measures to shield the electronic components (see, for example, Patent Reference 1).

However, the metal casing made of magnesium alloy or the like needs secondary processing such as surface polishing and anticorrosive treatment in order to reduce roughness of the surface. Therefore, there are problems of low productivity and very high cost.

As for a portable electronic device, in order to reduce size and weight, it is proposed that a casing formed by injection-molding a glass fiber reinforced resin, carbon fiber reinforced resin or the like having small thickness, light weight, high strength and high rigidity is used, other than the above-described metal casing made of magnesium alloy or the like.

However, in the casing made of a glass fiber reinforced resin or carbon fiber reinforced resin, the glass fiber or carbon fiber is exposed on the surface and the surface becomes rough, or the unevenness of the fibers appears clearly and the appearance of the casing is deteriorated. Although secondary processing such as surface coating and polishing is carried out, the coating is stripped off the part where the glass fiber or carbon fiber is exposed. Moreover, the carbon fiber breaking out from the surface of the casing may contaminate the periphery and occurrence of a short circuit due to the carbon fiber exposed from the surface of the casing may be anticipated.

Patent Reference 1: Japanese Patent Gazette No. H07-052798

SUMMARY OF THE INVENTION

Thus, in view of the foregoing status of the art, it is an object of this invention to provide an electronic device having a casing that prevents leakage of unwanted electromagnetic waves from inside, is not affected by external electromagnetic waves, has small thickness, light weight, high strength and high rigidity, and has excellent contact property with coating.

In order to achieve the above-described object, an electronic device according to this invention has at least a casing that has an electronic component housed therein. The casing is made of a carbon fiber reinforced resin having a conductive layer made of a mixture of a carbon fiber and a thermoplastic resin and an insulating layer where only the thermoplastic resin is exposed on a surface of the conductive layer.

In this manner, in the electronic device according to this invention, the casing made of the carbon fiber reinforced resin absorbs unwanted electromagnetic waves generated from the internal electronic component and also absorbs external electromagnetic waves. Occurrence of noise and electromagnetic interruption can be thus prevented. Moreover, since the casing is made of the carbon fiber reinforced resin having the conductive layer made of the mixture of the carbon fiber and the thermoplastic resin and the insulating layer where only the thermoplastic resin is exposed on the surface of the conductive layer, the casing has small thickness, light weight, high strength and high rigidity, and the carbon fiber is not exposed on the surface.

Therefore, the electronic device according to this invention does not have the problems of roughness of the surface of the casing and stripping of coating when it is used on the surface of the casing. The surface of the casing can be neatly finished. Moreover, there is no problem of contamination of the periphery by the carbon fiber breaking out from the surface of the casing, and occurrence of a short circuit due to the carbon fiber exposed from the surface of the casing can be avoided.

DESCRIPTION OF THE PREFERRED EMBODIMENTS

Hereinafter, an electronic device to which this invention is applied will be described in detail with reference to the drawings.

Figure 1:
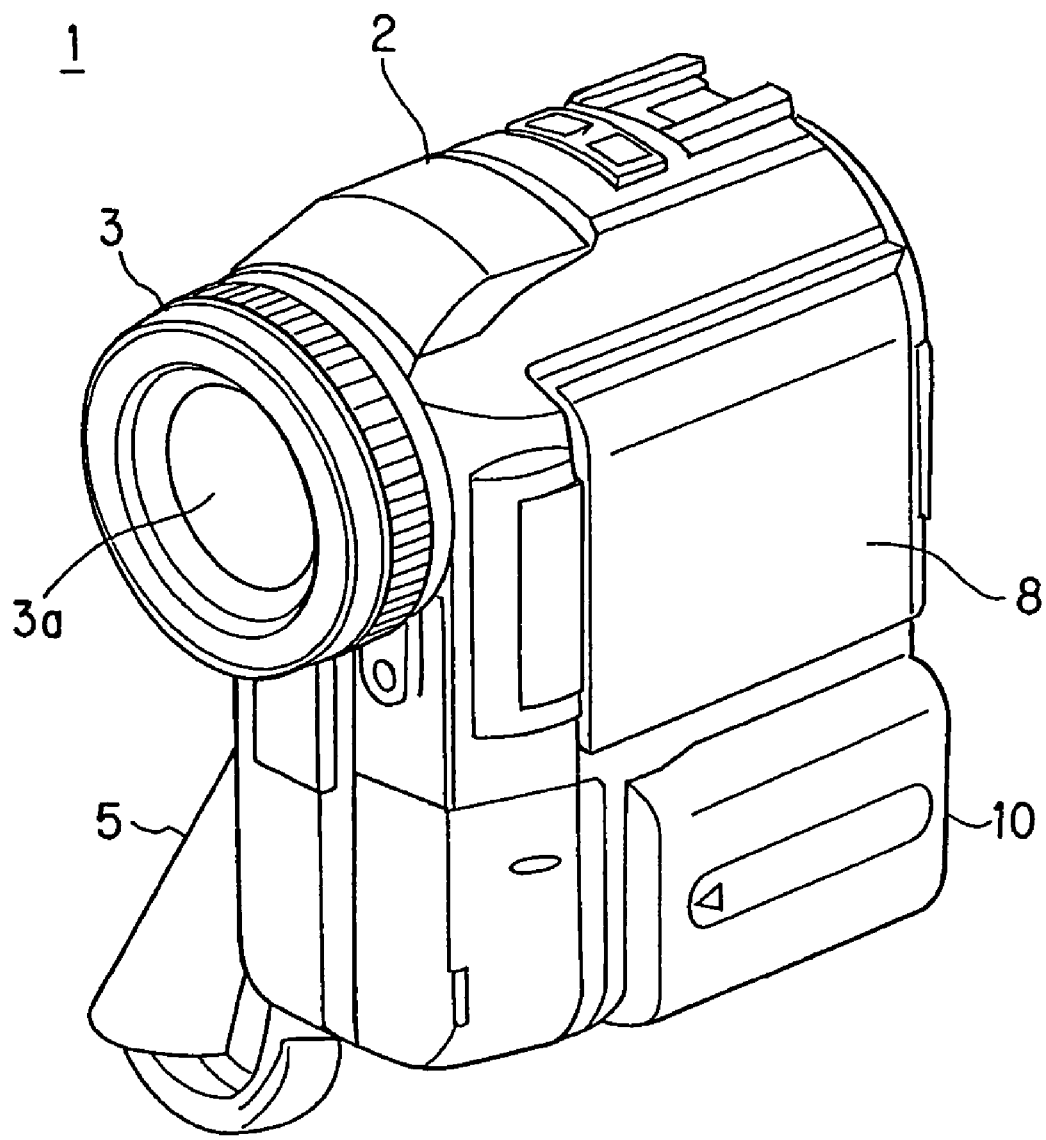
FIG. 1 is a perspective view showing a digital video camera to which this invention is applied, as viewed from its front side.
Figure 2:
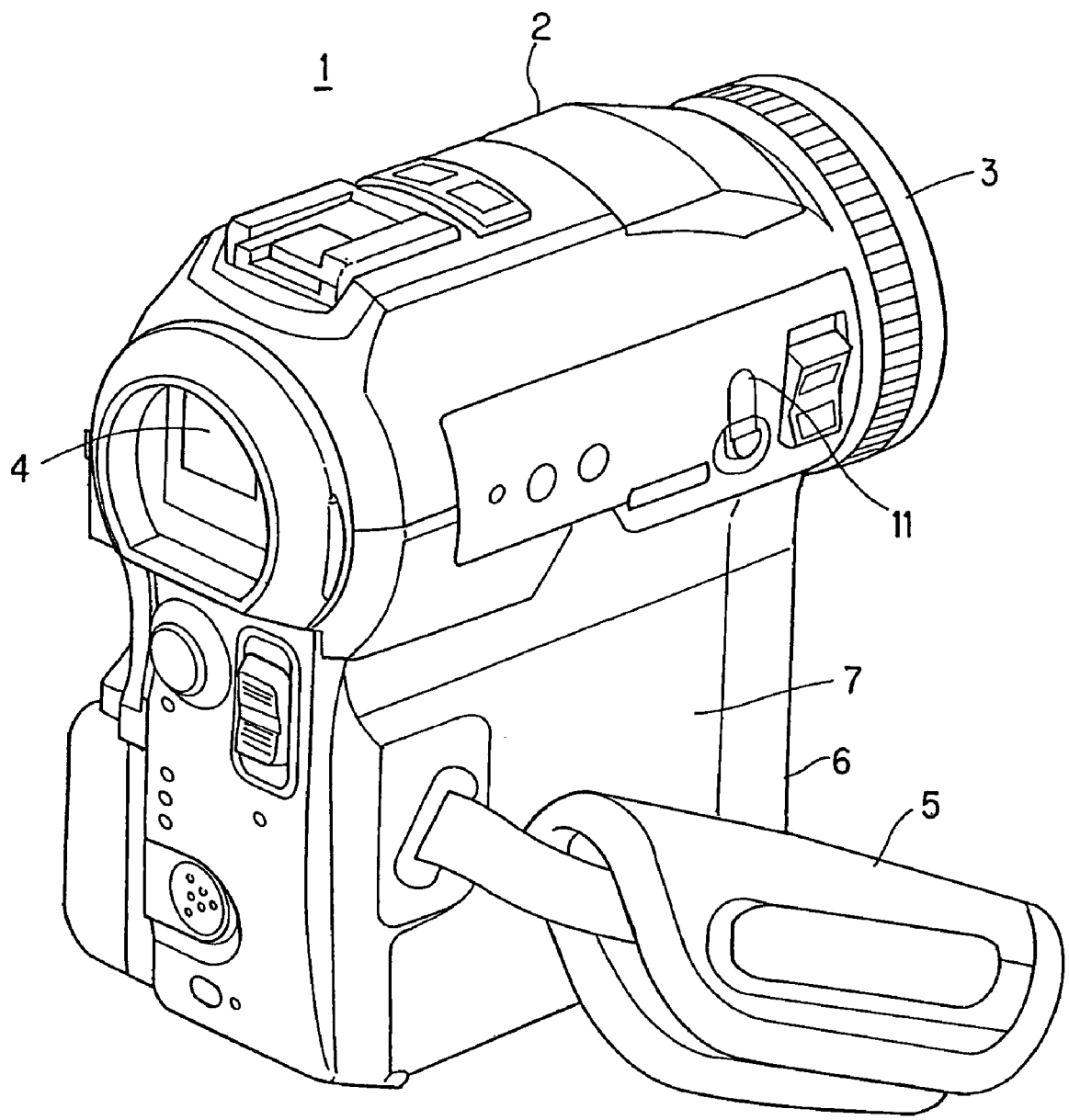
FIG. 2 is a perspective view showing the digital video camera, as viewed from its rear side.
Figure 3:
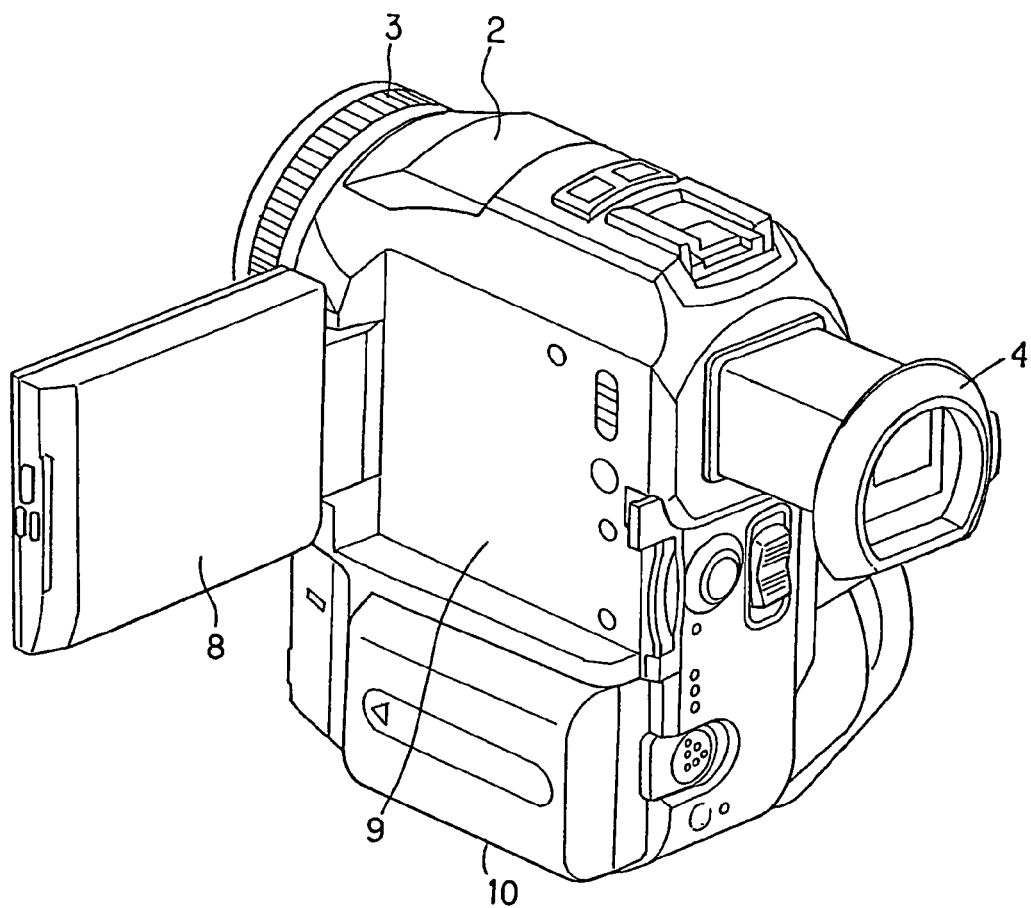
FIG. 3 is a perspective view showing a state where a panel part is opened from a body part of the digital video camera and where a view finder part is pulled out.

The electronic device to which this invention is applied is a camera-integrated digital video tape recorder (hereinafter referred to as digital video camera) 1, for example, shown in FIGS. 1, 2 and 3. This digital video camera 1 has a body part 2 having a substantially rectangular solid-shape as a whole. In this body part 2, an image pickup unit for picking up an image of an object, a display unit for displaying a picked-up image, an audio recording unit for recording sounds, a recording/reproducing unit for recording/reproducing image signals and audio signals from the image pickup unit and the audio recording unit, and operating buttons and switches for performing various operations.

On the front side of the body part 2, a lens part 3 is provided at which an image pickup lens 3a is exposed. On the rear side of the body part 2, a view finder part 4 for a person who picks up an image to view a liquid crystal display (LCD) displaying an image picked up by an internal charge coupled device (CCD) through the image pickup lens 3a is provided in such a manner that the view finder part 4 can be pulled out. On one lateral side of the body part 2, a holding part 6 is provided on which a grip belt 5 is attached for the person who picks up an image to hold the video camera 1. As a cover 7 attached to be freely open and close on the holding part 6 is opened, it is found that a cassette loading part for loading a tape cassette is provided inside. On the other lateral side of the body part 2 opposite to the side of the holding part 6, a panel part 8 is mounted to be freely open and close. When the panel part 8 is closed, as shown in FIG. 1, the panel part 8 is housed in a panel housing part 9 formed by cutting out the lateral side of the body part 2. When the panel part 8 is opened, as shown in FIG. 3, an image picked up by the image pickup lens 3a can be displayed on a liquid crystal panel (LCD) provided on a major surface of the panel part 8 facing the panel housing part 9, as well as on the above-described view finder part 4 on the rear side. Moreover, on the other lateral side of the body part 2, a battery 10 as a power source is removably mounted below the panel part 8.

Therefore, the person who picks up an image can picks up an image, holding by one hand the holding part 6 provided on the one lateral side of the body part 2 and viewing the view finder part 4 on the rear side, or viewing the liquid crystal panel when with the panel part 8 provided on the other lateral side of the body part 2 is opened.

Figure 4:
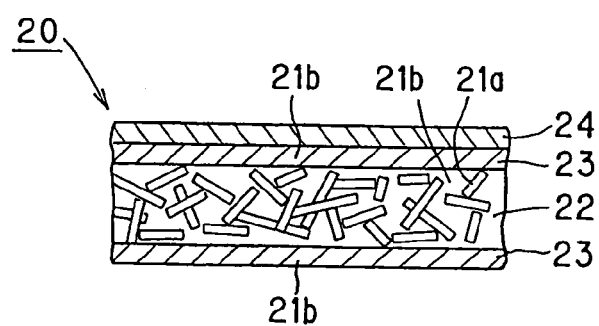
FIG. 4 is a sectional view showing an essential part of a casing that constitutes the digital video camera.

Meanwhile, this digital video camera 1 is characterized in that a casing 20 forming the outer casing of the above-described body part 2 and the panel part 8 is made of a carbon fiber reinforced resin (carbon fiber reinforced plastics) having a conductive layer 22 made of a mixture of a carbon fiber 21a and a thermoplastic resin 21b and an insulating layer 23 where only the thermoplastic resin 21b is exposed on the surface of the conductive layer 22, as shown in FIG. 4.

This casing 20 is formed by injection molding in which the temperature of the cavity surface of a metal mold is raised to a high temperature so that the carbon fiber 21a is not exposed on the surface. Specifically, when preparing this casing 20, the cavity of the metal mold is filled with a carbon fiber reinforced resin material containing the carbon fiber 21a and the thermoplastic resin 21b. In this case, as the temperature of the cavity surface is raised to a high temperature of 100° C. or higher and the temperature of the cavity surface is lowered after the completion of filling, the carbon fiber 21a is sunk in the thermoplastic resin 21b. As this carbon fiber 21a is sunk from the surface, the casing 20 having, as its core layer, the conductor layer 22 made of the mixture of the carbon fiber 21a and the thermoplastic resin 21b, and having, as its outer surface layer, the insulating layer 23 where only the thermoplastic resin 21b is exposed on the surface of the conductive layer 22, can be acquired. Since the temperature of the cavity surface is raised, the fluidity of the carbon fiber reinforced resin material is improved and it can be molded with a small thickness.

As the carbon fiber reinforced resin material, for example, TORAYCA long fiber pellets manufactured by Toray Industries, Inc. can be used. Specifically, using a carbon fiber reinforced resin containing the carbon fiber 21a at a rate of 10 to 30% by weight of the total weight, the casing 20 in which the carbon fiber 21a is not exposed on the surface can be acquired by the above-described injection molding. More preferably, if the content of the carbon fiber 21a is 15 to 25% by weight, the casing 20 having small thickness, light weight, high strength and high rigidity can be produced. By using a long fiber having a large aspect ratio for the carbon fiber 21a, the mechanical strength and conductivity can be improved. As the thermoplastic resin 21b, engineering plastics, for example, polybutylene terephthalate (PBT) resin, polyphenylene sulfide (PPS) resin, polyacetal (PA) resin, polycarbonate (PC) resin, polyethylene terephthalate (PET) resin, polyphenylene ether (PPE) resin or the like can be used. A conductive material such as carbon black may be added to the carbon fiber reinforced resin.

On the outer surface of the casing 20, an ornamental layer 24 is formed by coating. For this coating, brush painting, spraying, electrostatic coating or the like is used. As the coating material, a lacquer type material, enamel type material, ultraviolet/electron-beam hardening type material or the like is used.

As described above, since this casing 20 is made of the carbon fiber reinforced resin having the conductive layer 22 made of the mixture of the carbon fiber 21a and the thermoplastic resin 21b and the insulating layer 23 where only the thermoplastic resin 21b is exposed on the surface of the conductive layer 22, the casing 20 has small thickness, light weight, high strength and high rigidity, and the carbon fiber 21a is not exposed on the surface.

Therefore, in the digital video camera 1, there are no problems of roughness of the surface of the casing 20 and of stripping of the coating when the coating is applied on the surface of the casing 20. The surface of the casing 20 can be neatly finished, using the ornamental layer 24. Moreover, there is no problem of contamination of the periphery by the carbon fiber breaking out from the surface of the casing 20, and occurrence of a short circuit due to the carbon fiber exposed from the surface of the casing 20 is prevented. Therefore, the insulation property on the surface of the casing 20 can be realized.

Also, in the digital video camera 1, secondary processing such as polishing and anticorrosive treatment on the surface of the casing 20 is not necessary. Since the casing 20 has high molding property and allows a high degree of freedom in shape, the productivity can be improved significantly.

Figure 5:
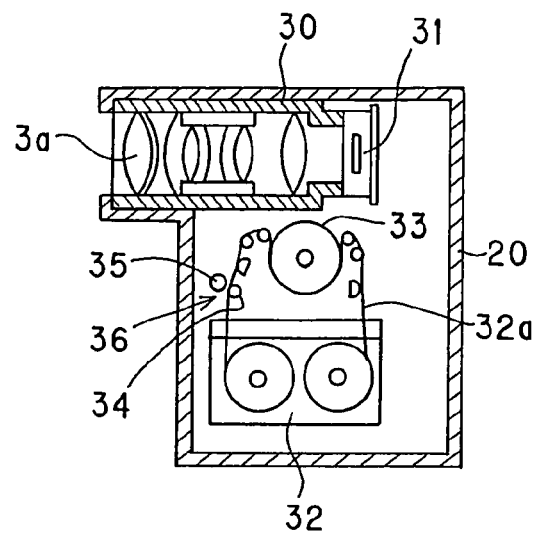
FIG. 5 is a schematic view showing an internal structure of the digital video camera.

Inside the casing 20, a lens cylinder 30 in which an optical system including the image pickup lens 3a is arranged, and a CCD 31 attached on the rear side of the lens cylinder 30 and adapted for picking up an image of an object formed y the lens cylinder 30 are provided, as shown in FIG. 5. Moreover, there are also provided a rotary head unit 33 for recording and reproducing signals to and from a magnetic tape 32a of a tape cassette 32 loaded in a tape cassette loading part, and a tape driving mechanism 36 for driving the magnetic tape 32 led by plural guide rollers and sandwiched between a pinch roller 34 and a capstan 35, at a constant speed.

Of these components, the CCD 31 is an electronic component that generates unwanted electromagnetic waves (unwanted radiation). Unwanted electromagnetic noise is also generated from a printed circuit board on which a driving control circuit or the like of the rotary head unit 33 is mounted. On the other hand, the head amplifier for amplifying a video signal picked up by the CCD 31 is an electronic component susceptible to external electromagnetic waves, though not shown.

In this digital video camera 1, the above-described casing 20 made of the carbon fiber reinforced resin absorbs the unwanted electromagnetic waves generated from the internal electronic components and also absorbs the external electromagnetic waves. This enables prevention of occurrence noise and electromagnetic interruption and enables realization of excellent electromagnetic shielding property.

Next, grounding in the digital video camera 1 will be described.

Figure 6:
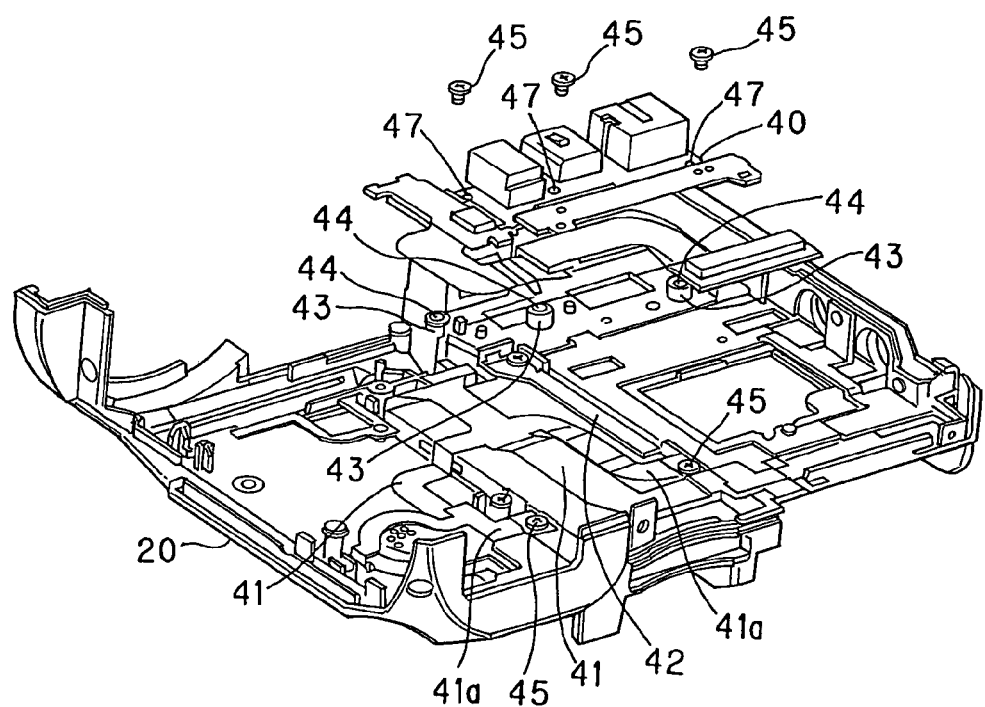
FIG. 6 is an exploded perspective view for explaining a structure for mounting a printed circuit board, a flexible wiring board and a metal frame to the casing of the digital video camera.
Figure 7:
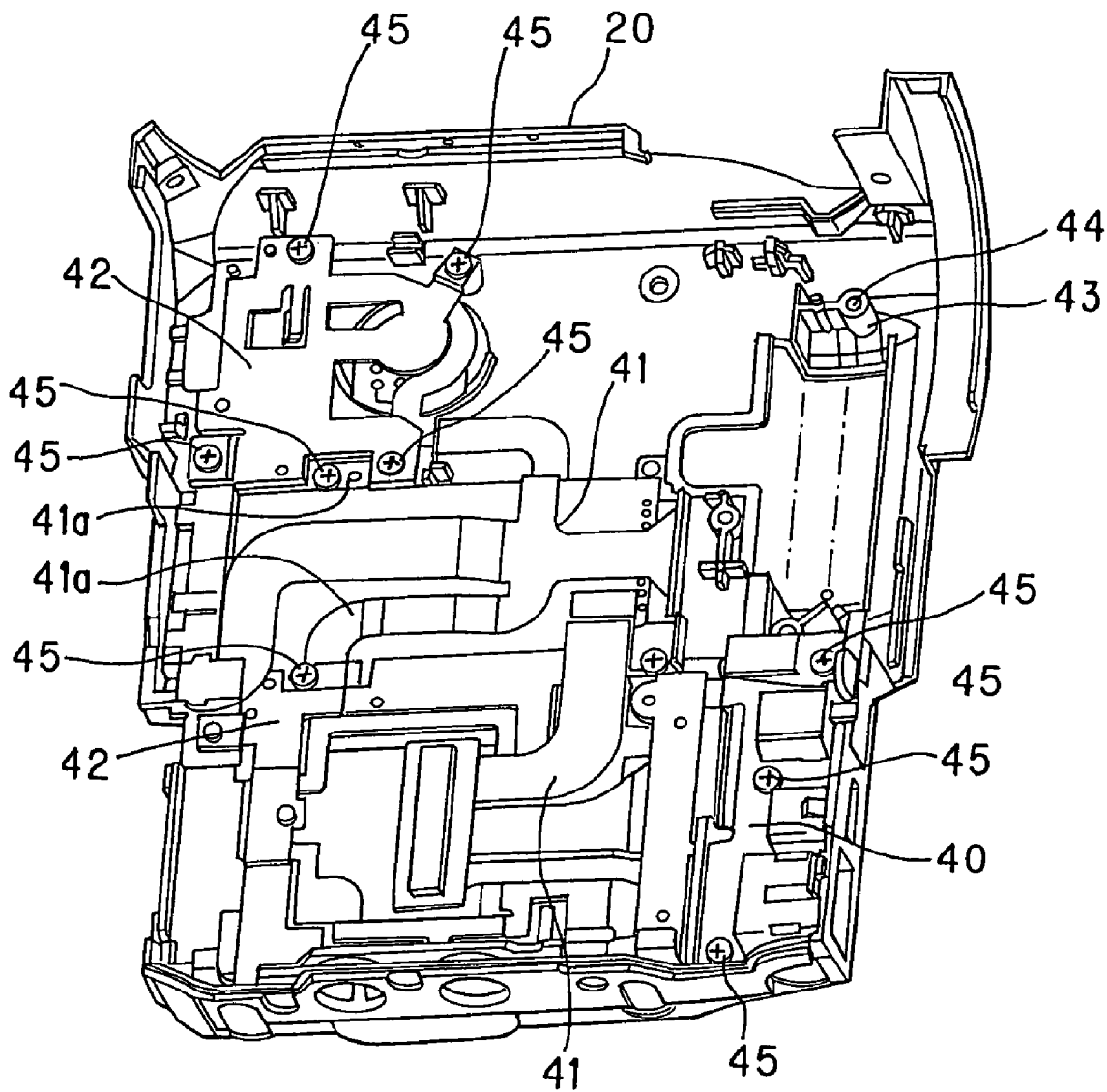
FIG. 7 is a perspective view for explaining the structure for mounting the printed circuit board, the flexible wiring board and the metal frame to the casing of the digital video camera.

On the inner surface of the casing 20, a printed circuit board 40 on which electronic components such as IC chips, connectors, passive elements and active elements are mounted, electronic components such as a driving motor, a flexible wiring board (wiring cable) 41 electrically connected with these electronic components and the printed circuit board 40, and a metal frame 42 supporting these electronic components, the printed circuit board 40 and various mechanisms are attached by screwing, for example, as shown in FIGS. 6 and 7.

Figure 8:
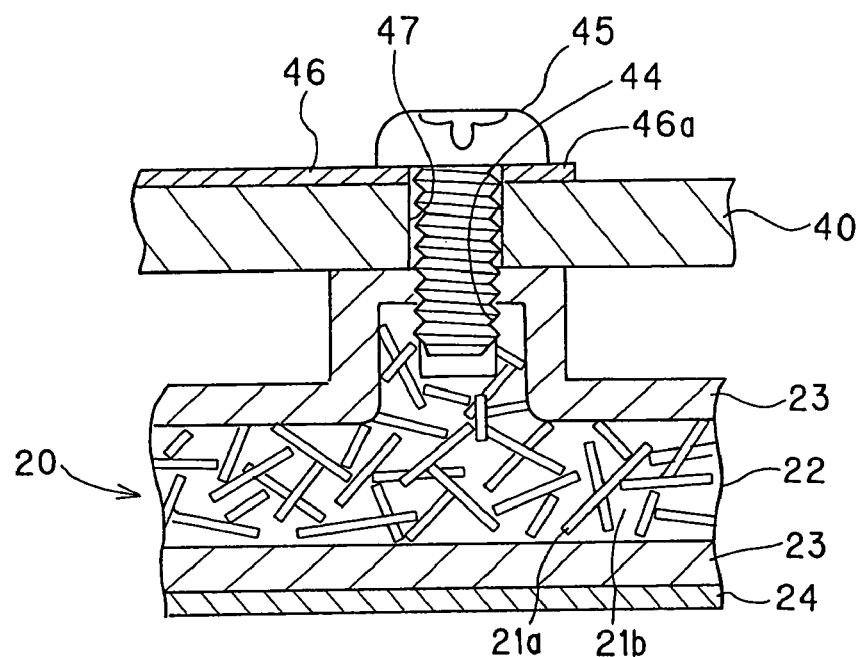
FIG. 8 is a sectional view showing an essential part of the structure for attaching the printed circuit board to the casing of the digital video camera.

Specifically, plural bosses 43 are projected on the inner surface of the casing 20, and screw holes 44 with a depth to be exposed to the conductive layer 22 from the insulating layer 23 are formed at the centers of the bosses 43, as shown in FIG. 8. The screw holes 44 are self-tap holes formed by screwing tap screws 45.

On a major surface of the printed circuit board 40 screwed to the casing 20, a conductor pattern 46 electrically connected to the electronic components, and through-holes 47 penetrating the printed circuit board 40 in the direction of the thickness at the position of the conductor pattern 46, are formed. The conductor patterns 46 is formed as a grounding pattern and has a land part 46a corresponding to the top part of the screw 45 on the periphery of the through-hole 47.

As the screws 45 are fitted with the screw holes 44 through the through-holes 47, the printed circuit board 40 is fixed on the inner surface of the casing 20 and the conductor pattern 46 is electrically continued to the conductive layer 22 via the screws 45.

Figure 9:
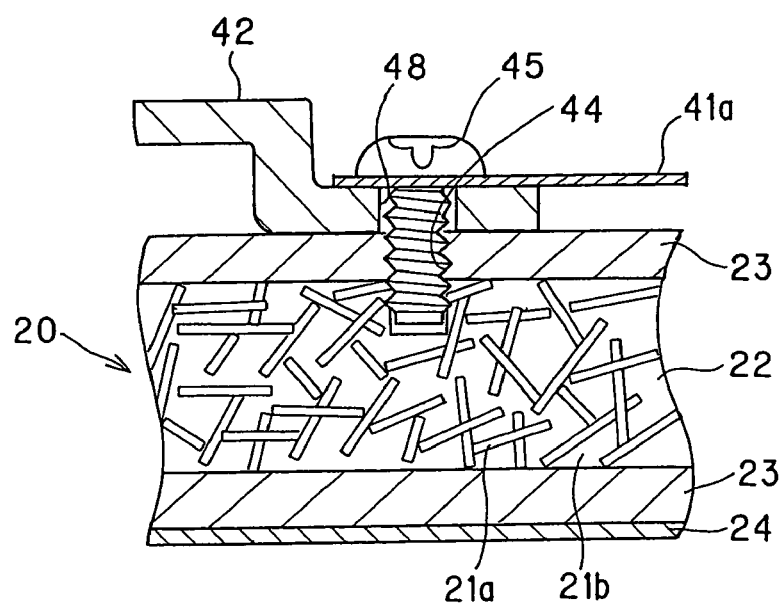
FIG. 9 is a sectional view showing an essential part of the structure for attaching the metal frame and the flexible wiring board to the casing of the digital video camera.

On the inner surface of the casing 20, the screw holes 44 for screwing the above-described flexible wiring board 41 and the metal frame 42 are formed, as shown in FIG. 9. In the metal frame 42, through-holes 48 for passing the screws 45 in the direction of the thickness are formed. As the screws 45 are fitted in the screw holes 44 via the through-holes 48, the metal frame 42 is fixed on the inner surface of the casing 20 and is electrically continued to the conductive layer 22 via the screws 45.

On the flexible wiring board 41, a wiring part 41a to be a grounding wire is branched and extended to the positions where the metal frame 42 is fixed. As the distal end of the wiring part 41a is screwed between the metal frame 42 and the screw 45, the flexible wiring board 41 is electrically continued to the conductive layer 22 via the metal frame 42 and the screw 45.

As described above, in the digital video camera 1, electrical continuity (grounding) with the conductive layer 22 of the casing 20 can be securely realized. This enables implementation of measures to prevent EMI corresponding to unwanted radiation and to strengthen immunity.

Moreover, in this digital video camera 1, as electrical continuity with the conductive layer 22 of the casing 20 is realized, occurrence of electrostatic breakdown of the electronic components due to overvoltage or overcurrent by shift of electric charges can be prevented. Measures to prevent electrostatic discharge (ESD) such as prevention of charging can be taken.

This invention is not limited to the above-described digital video camera 1 and can be broadly applied to electronic devices in which electronic components generating electromagnetic waves and electronic components susceptible to external electromagnetic waves are provided within its casing. Particularly, if this invention is applied to a portable electronic device, it is possible to realize further reduction in size and weight while taking measures to prevent EMI and ESD and maintaining the mechanical strength of the casing.

While the invention has been described in accordance with a certain preferred embodiment thereof illustrated in the accompanying drawings and described in the above description in detail, it should be understood by those ordinarily skilled in the art that the invention is not limited to the embodiment, but various modifications, alternative constructions or equivalents can be implemented without departing from the scope and spirit of the present invention as set forth and defined by the appended claims.

What is claimed is:

1. An electronic device comprising:
   a casing having a conductive layer made of a mixture of carbon fibers and a thermoplastic resin and a first insulating layer where only the thermoplastic resin is applied on a surface of the conductive layer, the casing further having a number of holes which extend through the insulating layer and into the conductive layer;
   a printed circuit board coupled to the casing such that the printed circuit board is arranged closer to the first insulating layer than to the conductive layer;
   one or more electronic components coupled to the printed circuit board;
   a driving motor; and
   a metal frame supporting the printed circuit board and the driving motor,
   the printed circuit board being coupled to the casing by use of a number of screws which are screwed into the number of holes of the casing which extend through the insulating layer and into the conductive layer such that an electrical connection is provided by way of the screws to the conductive layer of the casing.

2. The electronic device as claimed in claim 1, wherein a surface of the casing is coated.

3. The electronic device as claimed in claim 1, wherein the casing is formed by injection-molding the carbon fiber reinforced resin while raising a temperature of a cavity surface of a metal mold to a predetermined temperature so that the carbon fibers are not exposed on the surface.

4. The electronic device as claimed in claim 1, wherein casing is formed from a carbon fiber reinforced resin which contains the carbon fibers at a rate of 10 to 30% by weight of a total weight.

5. The electronic device as in claim 1, further comprising a flexible wiring board electrically connected to the one or more electronic components on the printed circuit board.

6. The electronic device as in claim 5, in which the metal frame and the printed circuit board are coupled to the casing by use of the number of screws which are screwed into the number of holes of the casing such that an electrical connection is provided therefrom to the conductive layer of the casing by way of the screws.

7. The electronic device as in claim 6, in which a distal end of a wiring part of the flexible wiring board is attached between a respective screw and the metal frame such that the flexible wiring board is electrically connected to the conductive layer by way of the screw and the metal frame.

8. The electronic device as in claim 1, further comprising a second insulating layer arranged on a surface on the conductive layer which is opposite to that in which the first insulating layer is arranged.

9. The electronic device as in claim 8, further comprising an ornamental layer arranged on an outer surface of the second insulating layer, said ornamental layer forming an outer surface of the casing.

* * * * *

UNITED STATES PATENT AND TRADEMARK OFFICE
CERTIFICATE OF CORRECTION

PATENT NO. : 7,310,236 B2  Page 1 of 1
APPLICATION NO. : 10/888290
DATED : December 18, 2007
INVENTOR(S) : Yoshitake Takahashi, Yoshihisa Tsuchida and Masayoshi Morikawa It is certified that error appears in the above-identified patent and that said Letters Patent is hereby corrected as shown below:

Column 1, line 41, "function the" should read --function of the--;

Column 3, line 19, "2, an" should read --2 are an--;

Column 3, line 53, "picks" should read --pick--;

Column 4, line 67, "is not" should read --are not--;

Column 5, line 6, "formed y" should read --formed by--;

Column 5, line 54, "patterns" should read --pattern--;

Column 7, line 1, "raising a" should read --raising the--;

Column 7, line 5, "casing" should read --the casing--;

Column 8, line 7, "on the" should read --of the--.

Signed and Sealed this

Sixteenth Day of December, 2008

JON W. DUDAS
*Director of the United States Patent and Trademark Office*